United States Patent
Ostrom et al.

(10) Patent No.: US 6,789,036 B2
(45) Date of Patent: Sep. 7, 2004

(54) MICROELECTRONIC TRANSIENT POWER GENERATOR FOR POWER SYSTEM VALIDATION

(75) Inventors: Kenneth Ostrom, Palos Verdes Estates, CA (US); Tim Ng, Monterey Park, CA (US); Clifford Duong, Fountain Valley, CA (US)

(73) Assignee: Primarion, Inc., Tempe, AZ (US)

( * ) Notice: Subject to any disclaimer, the term of this patent is extended or adjusted under 35 U.S.C. 154(b) by 0 days.

(21) Appl. No.: 10/053,973

(22) Filed: Jan. 22, 2002

(65) Prior Publication Data

US 2002/0096941 A1 Jul. 25, 2002

Related U.S. Application Data

(60) Provisional application No. 60/263,104, filed on Jan. 19, 2001.

(51) Int. Cl.$^7$ .................... G01D 3/00; H02M 3/135; G01R 31/36; G05F 3/26; H02J 1/00
(52) U.S. Cl. .................... 702/108; 323/313; 324/771; 363/124
(58) Field of Search .................... 702/63, 65, 108, 702/117, 121, 122; 714/736; 376/215; 324/426, 771; 323/299, 274, 312, 313; 327/103, 108, 143, 518, 530, 538; 307/70, 350; 326/30, 110; 363/124

(56) References Cited

U.S. PATENT DOCUMENTS

| | | | |
|---|---|---|---|
| 4,042,830 A | | 8/1977 | Kellenbenz et al. .......... 307/40 |
| 5,287,261 A | * | 2/1994 | Ehsani ....................... 363/124 |
| 5,394,025 A | | 2/1995 | Pierson ....................... 327/530 |
| 5,886,515 A | | 3/1999 | Kelly .......................... 323/313 |
| 5,889,395 A | * | 3/1999 | Lundberg .................... 323/313 |
| 5,942,886 A | | 8/1999 | Kelly .......................... 323/312 |
| 6,198,302 B1 | * | 3/2001 | Dougherty .................. 324/771 |
| 6,281,724 B1 | * | 8/2001 | Ellis ........................... 327/143 |

FOREIGN PATENT DOCUMENTS

JP     11 327500     11/1999

OTHER PUBLICATIONS

"Modular Electronic Power Supply Load Device," IBM Technical Disclosure Bulletin, Mar. 1992, vol. 34, No. 10B.

* cited by examiner

Primary Examiner—John Barlow
Assistant Examiner—John Le
(74) Attorney, Agent, or Firm—Theodore E. Galanthay

(57) ABSTRACT

A transient current generator for testing microelectronic power regulator systems is provided. The current generator includes a current source and one or more transistors to provide current or sink current to a microelectronic power delivery system. The generator may be used to test a microprocessor power delivery system by replacing the microprocessor with one or more of the generators of the present invention.

12 Claims, 3 Drawing Sheets

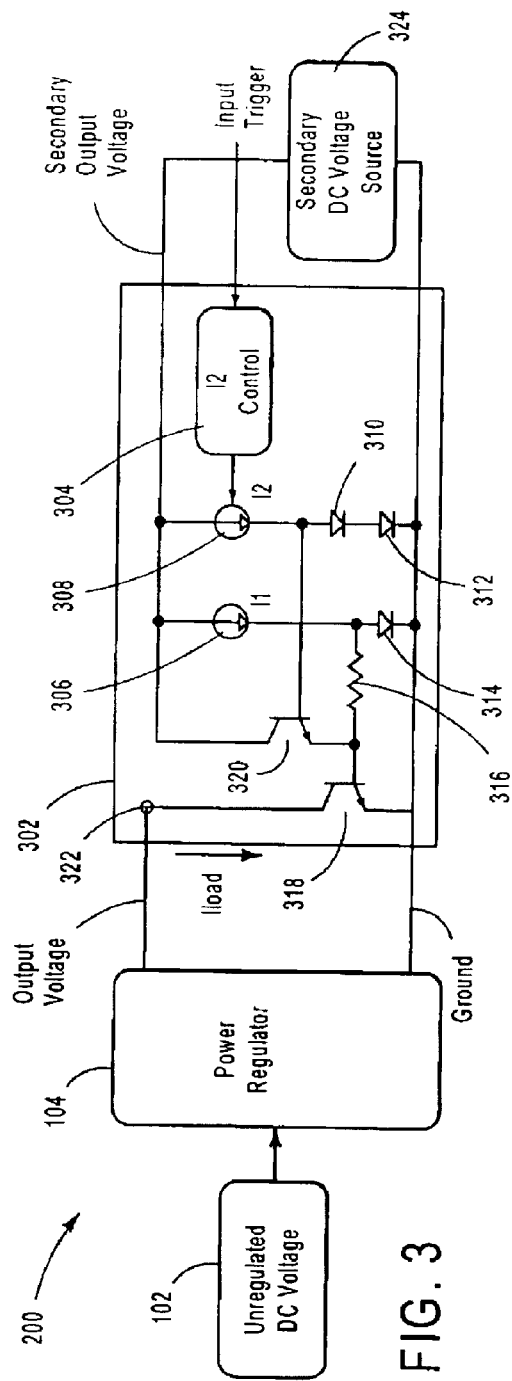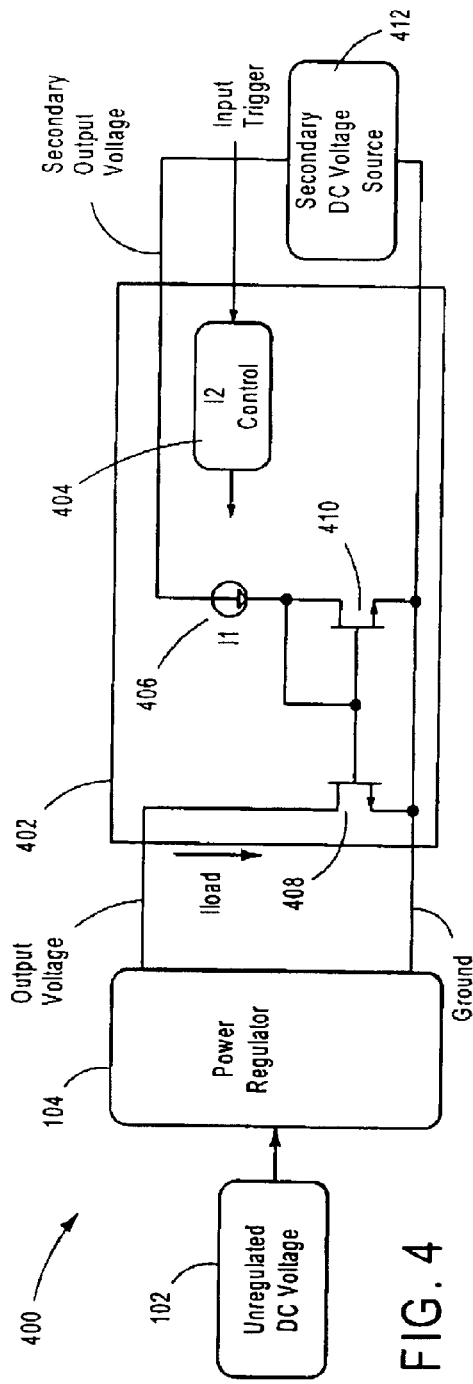
FIG. 3
FIG. 4

MICROELECTRONIC TRANSIENT POWER GENERATOR FOR POWER SYSTEM VALIDATION

CROSS REFERENCE TO RELATED APPLICATIONS

This Application claims priority to Provisional Application Serial No. 60/263,104, entitled Fast Transient Generator for Power System Validation, filed Jan. 19, 2001.

FIELD OF THE INVENTION

The present invention generally relates to power regulation systems for microelectronic devices such as microprocessors. More particularly, the invention relates to devices for producing a load current across a power regulation system that emulates transient power demands or spikes produced by a microelectronic device and to systems including the device.

BACKGROUND OF THE INVENTION

As the speed and integration of microelectronic circuits such as microprocessors increase, the speed and current of the power required to operate the circuits generally increases. The increased current load at higher speeds often results in severe current transients in the power delivery system. The current transients, if not regulated or accounted for, can cause noise on the power supply, which in turn may induce errors on the microprocessor. Accordingly, it is desirable to design power supply systems that are able to regulate transient current events.

Simulation modeling is often used to design power supply systems and predict the performance of the systems, often prior to completion of the design of the microprocessor. Although modeling of the power supply systems facilitates design of the system, modeling generally cannot account for all variables that contribute to generating power transients. In addition, even when simulation modeling is employed to design power systems, final testing of the power supply systems, particularly under severe dynamic transient conditions, typically requires coupling a power regulation system to a microprocessor and operating the microprocessor, and thus requires that the design of the microprocessor be complete. Because the testing is performed after final design of the microprocessor, any desired changes to the microprocessor and/or the power delivery system are difficult and costly. In addition, testing the operating conditions of the power delivery system while operating the microprocessor may make it difficult to determine the source of any power supply or demand irregularities. Accordingly, improved methods and apparatus for testing the performance of a microelectronic power supply are desired.

SUMMARY OF THE INVENTION

The present invention provides an apparatus for testing microelectronic power regulation systems. More particularly, the invention provides a circuit for producing power which emulates transient power events that might occur during operation of a microelectronic device such as a microprocessor. In addition, the invention facilitates design optimization or improvement of the power delivery system by allowing testing of the systems without requiring final design of the microprocessors for which the systems will be used.

In accordance with one embodiment of the invention, a transient load generator includes a control circuit and a transistor configured to turn on and off to emulate a transient power event.

In accordance with one embodiment of the present invention, a transient load generator includes a first output voltage source, a second output voltage source, a first current source coupled to the second voltage source, a second current source coupled to the second voltage source, a control circuit coupled to the second current source, a first transistor having a having a base region coupled to the first current source and a collector region coupled to the first output voltage source, and a second transistor having a base coupled to the second current source, and an emitter region coupled to the base region of the first emitter. The generator may also include additional components such as resistors and diodes to facilitate formation of power spikes that emulate transient events produced by a microprocessor.

In accordance with another embodiment of the invention, a transient load generator includes a first voltage source, a second voltage source, a control circuit, a first current source coupled to control circuit and the second voltage source, a first transistor having a gate region coupled to the current source, a source region tied to ground, and a drain region tied to the first voltage source; and a second transistor having a gate region and a drain region tied to the current source, and a source region tied to ground.

In accordance with another embodiment of the invention, an assembly includes a substrate, one or more transient load generators coupled to a portion of the substrate, and may also include one or more secondary power regulators and/or decoupling capacitors coupled to additional portions of the substrate.

BRIEF DESCRIPTION OF THE DRAWINGS

A more complete understanding of the present invention may be derived by referring to the detailed description and claims, considered in connection with the figures, wherein like reference numbers refer to similar elements throughout the figures, and:

FIG. 3 is a schematic illustration of a transient load generator in accordance with another embodiment of the invention and a power regulation system;

FIG. 4 is a schematic illustration of a transient load generator in accordance with yet another embodiment of the invention and a power regulation system;

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF EXEMPLARY EMBODIMENTS

The present invention may be described herein in terms of various functional components and various processing steps.

It should be appreciated that such functional components may be realized by any number of hardware or structural components configured to perform the specified functions. For example, the present invention may employ various integrated components comprised of various electrical devices, e.g., resistors, transistors, capacitors, diodes and the like, whose values may be suitably configured for various intended purposes. In addition, the present invention may be practiced in any integrated circuit application where high-frequency, high-amplitude current transient power formation is desired. Such general applications that may be appreciated by those skilled in the art in light of the present disclosure are not described in detail. Further, it should be noted that while various components may be suitably coupled or connected to other components within exemplary circuits, such connections and couplings can be realized by direct connection between components, or by connection through other components and devices located therebetween.

The invention is conveniently described below in connection with forming a load current across a power regulation system that emulates transient power events that occur during operation of a microprocessor. However, the generators and systems of the present invention may be used to emulate transient events of other microelectronic devices such as memory devices and the like. Using a transient generator of the present invention is advantageous because the generator is suitable for producing predictable and repeatable load currents, whereas a transient power demand or surge produced by a microprocessor is often a complex function of logic gate based switching, which is often difficult to repeat with a regular pattern. Thus, the present invention provides improved methods and apparatus for testing a microprocessor power delivery system.

Figure 1:
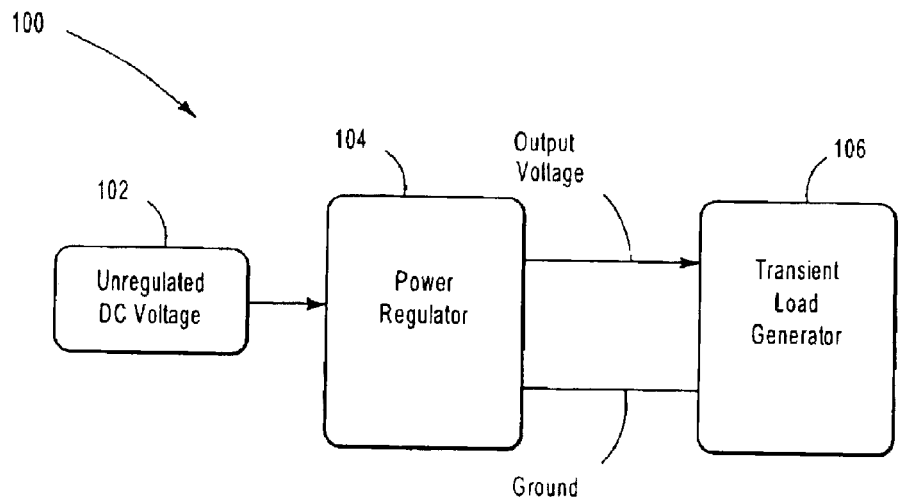
FIG. 1 is a schematic illustration of a power regulation system and a transient load generator in accordance with the present invention.

FIG. 1 schematically illustrates a system 100, including an unregulated power source 102, a power regulator 104, and a transient load generator 106. As described in more detail below, source 102 and regulator 104, along with any secondary regulators and/or discrete components, are configured to provide suitable power to a microelectronic device and to respond to any transient power events that result during operation of the microelectronic device.

Unregulated power source 102 of system 100 is generally configured to convert alternating current (AC) power obtained from a typical AC power outlet to direct current (DC) power to, for example, provide suitable DC power for a motherboard of a computer. For example, in accordance with one exemplary embodiment of the present invention, source 102 is configured to convert 110 volt AC power to about 3.3 volts to about 15 volts DC power at about 1 amp to about 20 amps. In accordance with one aspect of this embodiment, source 102 includes multiple DC power outputs—e.g., about 12 volts at about 1 amp, about 5 volts at about 5 amps, at about 3.3 volts at about 30 amps to supply the power to, for example, various types of microelectronic devices which may be coupled to the motherboard. In accordance with alternative embodiments of the present invention, source 102 may include any number of DC power outputs, and the amount of power associated with each output may vary in accordance with a type of device coupled to the output of source 102.

Power regulator 104 is a DC-to-DC converter, which is designed to convert output from source 102 to higher current, lower voltage power. In accordance with one exemplary embodiment of the present invention, regulator 104 receives power (e.g. 3.3 volts at 30 amps) from source 102 and converts the power to about 1.15 volts at about 100 amps. Regulator 104 may be a linear regulator, a switching regulator, or any other suitable type of power controller; however, in accordance with one exemplary embodiment of the present invention, regulator 104 comprises a switching regulator such as a Buck regulator.

System 100 may also optionally include discrete components and/or secondary power regulators, discussed in more detail below in connection with FIGS. 6 and 7 to facilitate rapid response power transfer to the microprocessor. The components may include capacitors to store an appropriate charge and discharge the energy as the microprocessor demands power.

Transient power generator 106 is designed to generate a load current across regulator 104 and secondary or discrete components that form part of microprocessor power supply system. The current load produced by generator 106 is configured to emulate transient power spike that may be produced by and during operation of a microprocessor. The current level and duration of such transient events is typically a factor of the number of microprocessor gates and the speed at which the microprocessor transistors switch.

Figure 2:
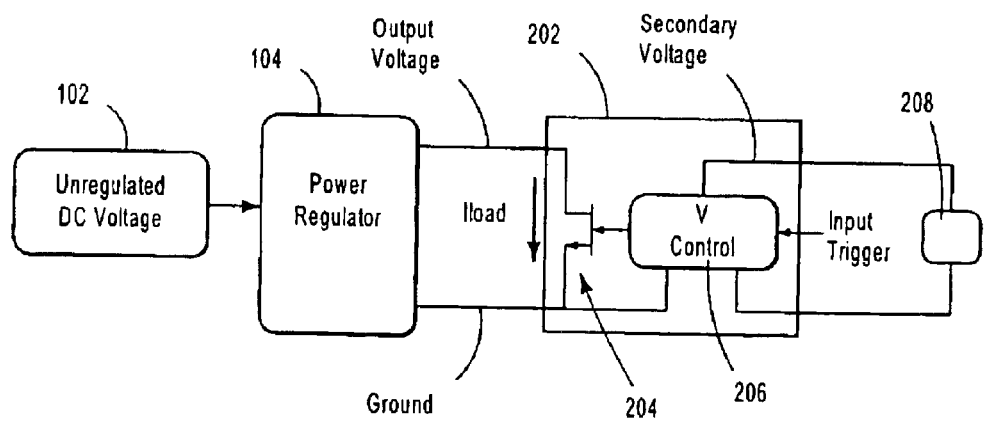
FIG. 2 is a schematic illustration of a transient load generator in accordance with one embodiment of the invention and a power regulation system.

FIGS. 2-4 illustrate exemplary transient load generators in accordance with various embodiments of the invention. In general, each generator includes at least one current source coupled to a switch to controllably generate a power transient similar to power transients that might be formed when a microprocessor is coupled to source 102, power regulator 104, and any secondary power regulators and/or discrete components.

FIG. 2 illustrates a system 200 including power source 102, power regulator 104, and a transient load generator 202. Transient load generator 202 includes a transistor 204 coupled to a voltage control circuit 206, which is configured to receive an input trigger signal. Circuit 206 is preferably coupled to a second voltage source 208, having a sufficient voltage to drive transistor 204 (e.g., greater than the voltage output of regulator 104).

To form a transient current spike from a low to high value, transistor 204 is initially in an "off" or low state. When circuit 206 receives an input trigger, circuit 206 generates a signal to turn transistor 204 from "off" to "on" in a controlled and repeatable fashion. Similarly, a transient power spike in the opposite direction, namely from high to low, is formed when circuit 206 receives an input trigger, and circuit 206 provides a suitable voltage to turn transistor 204 from an "on" state to an "off" state.

Transistor 204 may be any suitable switch, and in accordance with the illustrated embodiment, is a metal-oxide-semiconductor (MOS) transistor. Circuit 206 is suitably configured to drive transistor 204 with appropriate control signal amplitude and time profile to generate the desired output transient pulse. In addition, circuit 206 provides a proper impedance match for trigger source 208 (e.g., 50 ohms) such that the high frequency pulse characteristics of the trigger signal are preserved. Trigger source 208 maybe a custom circuit integrated with circuit 206 or it may be a readily available commercially high frequency pulse source.

FIG. 3 illustrates another system 300 including a power source 102, a power regulator 104, and a transient load generator 302 in accordance with the present invention. Generator 302 includes a current control circuit 304, a first current source 306, a second current source 308, diodes 310, 312, and 314, a resistor 316, and transistor 318 and 320. Transistor 318 and diode 314 are scaled in emitter area such that, when coupled to resistor 316, the quiescent current of transistor 318 is approximately n*I1, where n>>1 and is nominally independent of the voltage supplied by regulator 104 at node 322. System 300 also includes a secondary voltage source 324, having, for example an output voltage of greater than about one volt (e.g., about 5 volts) to drive transistor 320.

In operation, a low to high transient current is generated using generator 302 as follows. I2 from current source 308 is initially at a low state (e.g., zero or near zero amps) and diodes 310 and 312 and transistor 320 are in an "off" state. When circuit 304 receives an input trigger signal at circuit 304, circuit 304 sends a corresponding signal to current source 308, and source 308 transitions from an "off" state to an "on" state. Current, I2, from current source 308 activates diodes 310 and 312 and transistor 320, which change from an "off" states to an "on" state, and transistor 320 and diodes 310 and 312 drive transistor 318, which emits a current of about n*I2. Similarly, a high to low transient current is generated when control circuit 304 receives an input trigger signal and circuit 304 transmits a suitable signal to current source 308 to turn source 308 to an "off" state.

FIG. 4 illustrates another system 400 in accordance with another embodiment of the invention. Similar to systems 200 and 300, system 400 includes a power source 102, a primary power regulator 104, and transient generator 402.

Transient generator 402 includes a control circuit 404, a current source 406, a first transistor 408, a second transistor 410, and a secondary voltage source 412. Transistors 408 and 410 are scaled in active area such that the quiescent current of transistor 408 is approximately n*I1, where n>>1, when transistor 408 is in an "on" state.

In operation, a current transient from a low to a high current level is created as follows. Initially current source 406 and transistors 408 and 410 are in an "off" state and I1 is zero or near zero amps. When circuit 404 receives an input trigger signal, circuit 404 converts the input trigger signal to a signal suitable to turn current source 406 from an "off" state to an "on" state. Once source 406 is "on" and I1 is established, transistor 410 is activated, which in turn activates transistor 408 and establishes Iload across power regulator 104. Similarly, a high to low transient current is established when circuit 404 receives an input trigger signal, which is converted by circuit 404 to a signal suitable for turning current source 406 from an "on" state to an "off" state.

Figure 5:
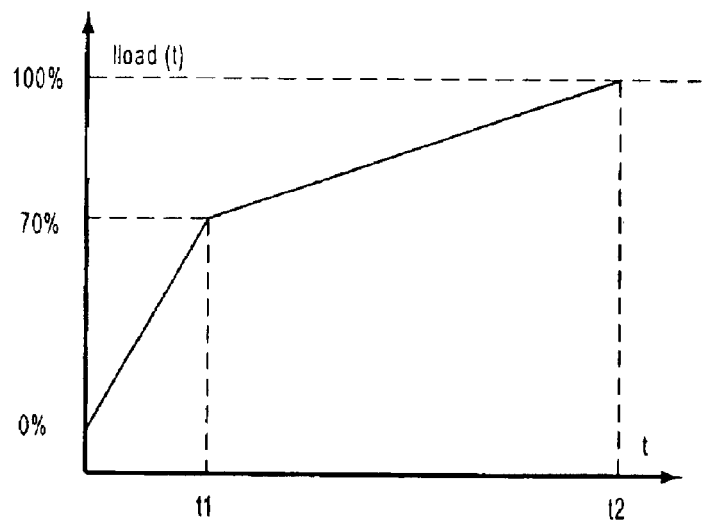
FIG. 5 is a graph illustrating an output from a transient load generator in accordance with the present invention.

FIG. 5 illustrates a graph of a typical transient load event resulting from operation of a microprocessor and thus a desired Iload, in terms of percent of a total, versus time produced by a transient generator (e.g., any of generators 202, 302, or 402) in accordance with the present invention. As illustrated, a typical load profile rises to about 70 percent of the maximum in a time interval t1, which is typically about 200 pico seconds to about 500 pico seconds, or less. The load current then rises from the about 70 percent of maximum level to the maximum level in a time interval t2-t1, which is typically about 10 nano seconds to about 40 nano seconds. The transient generators of the present invention generate current profiles similar to the profile illustrated in FIG. 5 by employing a suitable control circuits (e.g., circuits 206, 304 or 404) program; circuits 206, 304, and 404 may alternatively be programmed to obtain other desired current profiles by varying the time intervals, the amplitude, or both. For example, a profile may include a current ramp from 0 percent of maximum to about 35 percent of maximum during a first interval t1, and from 35 percent of maximum to about 50 percent of maximum during a time interval of t2-t1.

Figures 6, 7:
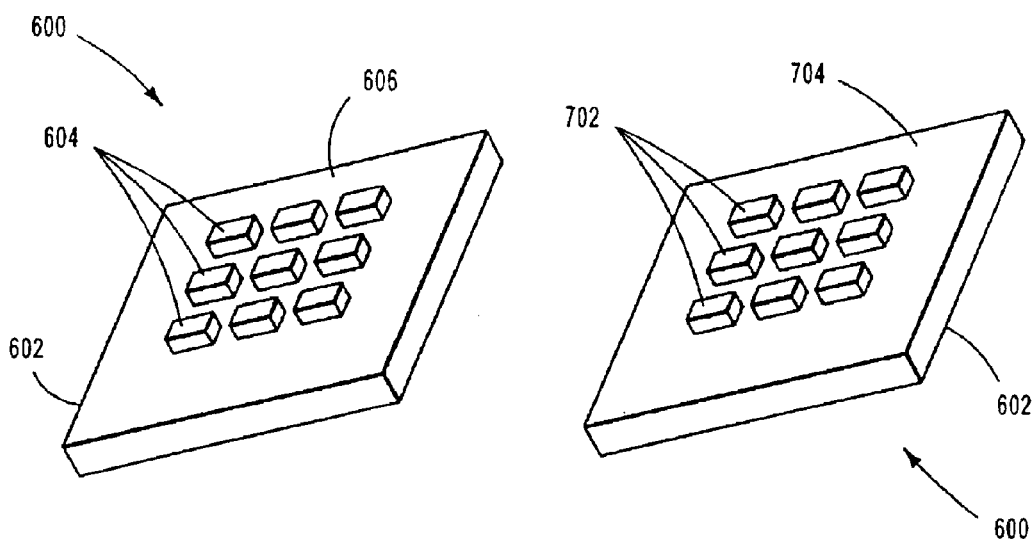
FIG. 6 illustrates a plurality of transient load generators coupled to a substrate in accordance with the present invention.
FIG. 7 illustrates a plurality of secondary regulators coupled to a portion of the substrate illustrated in FIG. 6.

FIGS. 6 and 7 illustrate, respectively, a microprocessor assembly 600, including a substrate 602 and a plurality of decoupling capacitors 702 attached to a bottom portion of substrate 602. Substrate 602 may include any suitable material and is preferably a multi-layered substrate as is often used in forming a microprocessor package. Similarly, capacitors 702 are preferably the same capacitors used to form a microprocessor package. Alternatively, some or all of capacitors 702 may be replaced with secondary power regulators.

In accordance with an exemplary embodiment of the invention, one or more transient generators (e.g., one or more of generators 202, 302, or 402) are coupled to a top portion 606 of substrate 602 in place of a microprocessor. In other words, the transient generator(s) take the place of the microprocessor on substrate 602. In this case, an entire power delivery system including any capacitors 702, other discrete component, and/or any other power regulation circuits can be stressed and tested using the generators of the present invention. In the case where multiple generators 604 are attached to substrate 602, each generator may be independently configured to emulate a portion of a microprocessor, and the sum of the transient loads produced by generators 604 is designed to approximately equal a total transient current produced by or predicted to be produced by a microprocessor. Each generator 604 may be controlled in a time aligned fashion to create a maximum current load to the power supply, in a skewed fashion to create a more complex load to the power supply, or in any other desired fashion.

While the present invention is set forth herein in the context of the appended drawing figures, it should be appreciated that the invention is not limited to the specific form shown. For example, although the transient load generators are illustrated with specific forms of transistors as switches, other switching devices and/or other forms of transistors may be substituted for the illustrative transistors. Various other modifications, variations, and enhancements in the design and arrangement of the method and apparatus set forth herein, may be made without departing from the spirit and scope of the present invention.

We claim:

1. A transient load generator for testing a microelectronic power delivery system, the generator comprising:
   a first voltage source having a first output voltage;
   a second voltage source having a second output voltage, wherein the second output voltage is greater than the first output voltage;
   a first current source coupled to the second voltage source;
   a second current source coupled to the second voltage source;
   a control circuit configured to receive an input trigger signal and transmit a corresponding signal to the second current source to switch the current source from an off state to an on state;
   a first transistor coupled to the first voltage source and the first current source; and
   a second transistor coupled to the second voltage source and the first transistor.

2. The transient load generator of claim 1, wherein the first current source is coupled in parallel to the second current source.

3. The transient load generator of claim 1, wherein the first transistor is a bipolar transistor having a base region coupled to the first current source and a collector region coupled to the first voltage source.

4. The transient load generator of claim 1, wherein the second transistor is a bipolar transistor having a base region coupled to the second current source, a collector region coupled to the second voltage source, and an emitter region coupled to the first transistor.

5. The transient load generator of claim 1, further comprising a resistor coupled between the first current source and the first transistor.

6. The transient load generator of claim 1, further comprising a diode coupled to the second current source.

7. The transient load generator of claim 1, further comprising a diode coupled to the first current source.

8. A power regulation system comprising the transient load generator of claim 1.

9. A transient load generator for testing a microelectronic power delivery system, the generator comprising:

a first voltage source having a first output voltage;

a second voltage source having a second output voltage, wherein the second output voltage is greater than the first output voltage;

a current source coupled to the second voltage source;

a first transistor coupled to the current source and to ground; and a second transistor coupled to the current source and to ground.

10. The transient load generator of claim 9, wherein the first and second transistors comprise MOS transistors.

11. The transient load generator of claims 10, wherein a gate region of the first transistor is coupled to the gate region of the second transistor.

12. A power regulation system comprising the transient load generator of claim 9.

* * * * *